United States Patent [19]
Strenz

[11] Patent Number: 6,111,294
[45] Date of Patent: Aug. 29, 2000

[54] SEMICONDUCTOR DEVICE AND METHOD FOR ITS FABRICATION

[75] Inventor: Robert Strenz, Regensburg, Germany

[73] Assignee: Siemens Aktiengesellschaft, Munich, Germany

[21] Appl. No.: 09/201,734

[22] Filed: Nov. 30, 1998

[30] Foreign Application Priority Data

Nov. 28, 1997 [DE] Germany ............ 197 52 848

[51] Int. Cl.[7] .................. H01L 27/02; H01L 29/08
[52] U.S. Cl. .................. 257/351; 257/371; 257/299; 257/345; 257/500
[58] Field of Search ................ 257/500, 345, 257/371, 365, 351, 299, 503; 327/148, 157, 536; 375/374

[56] References Cited

U.S. PATENT DOCUMENTS

| | | | |
|---|---|---|---|
| 4,138,782 | 2/1979 | De la Moneada et al. | 438/234 |
| 5,321,293 | 6/1994 | Mojaradi et al. | 257/369 |
| 5,336,915 | 8/1994 | Fujita et al. | 257/369 |
| 5,708,290 | 1/1998 | Cacciola et al. | 257/500 |

FOREIGN PATENT DOCUMENTS 0 822 596 A2   2/1998   European Pat. Off. .

OTHER PUBLICATIONS

K. Hoffmann: "VLSI–Entwurf", $2^{nd}$ edition, 1993, pp. 404–405.

*Primary Examiner*—Tom Thomas
*Assistant Examiner*—Shouxiang Hu
*Attorney, Agent, or Firm*—Herbert L. Lerner; Laurence A. Greenberg; Werner H. Stemer

[57] ABSTRACT

A semiconductor device has a semiconductor substrate of a first conductivity type. A first well of a second conductivity type is disposed in the semiconductor substrate. A second well of the first conductivity type is disposed in the first well. A third well of the second conductivity is disposed in the second well. A MOS transistor having a source region and a drain region of the first conductivity type is disposed in the third well.

6 Claims, 3 Drawing Sheets

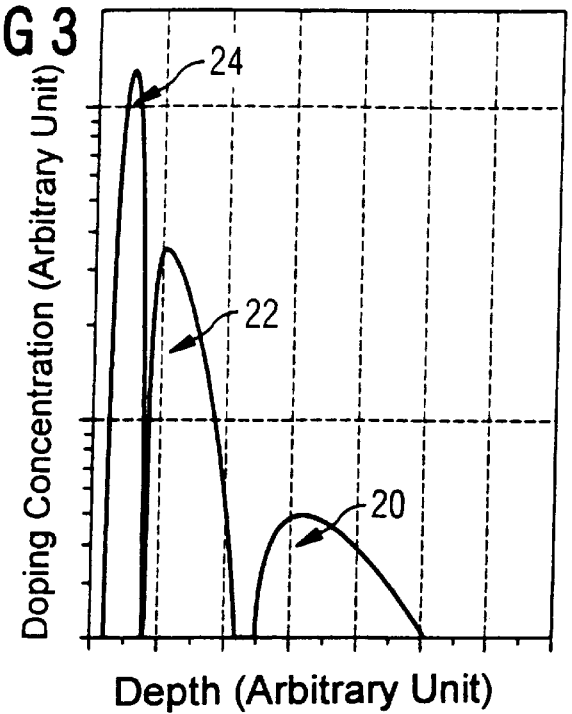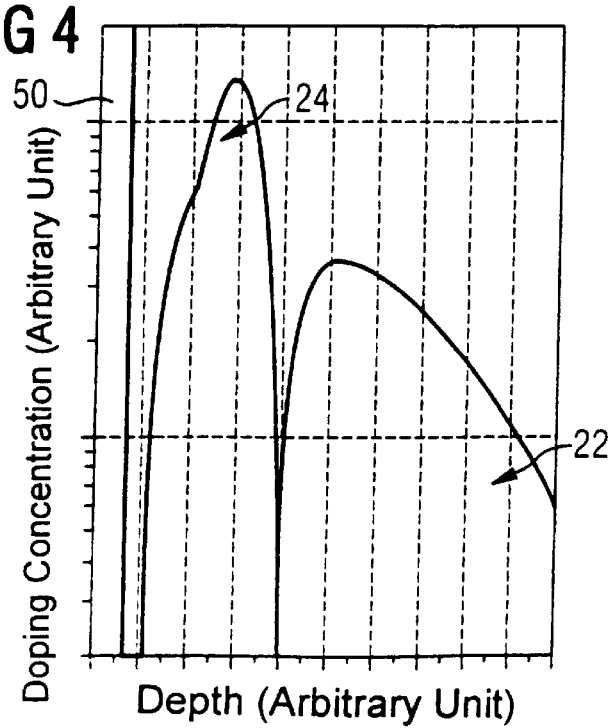

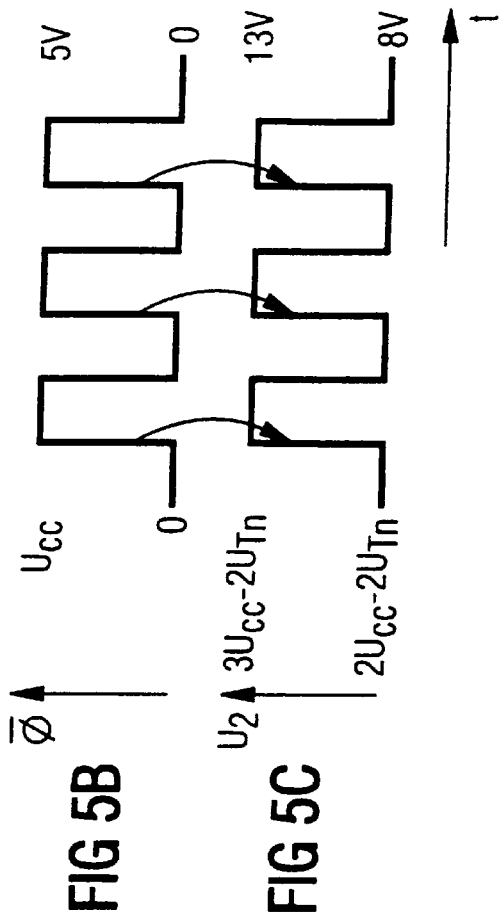
FIG 5B
FIG 5C
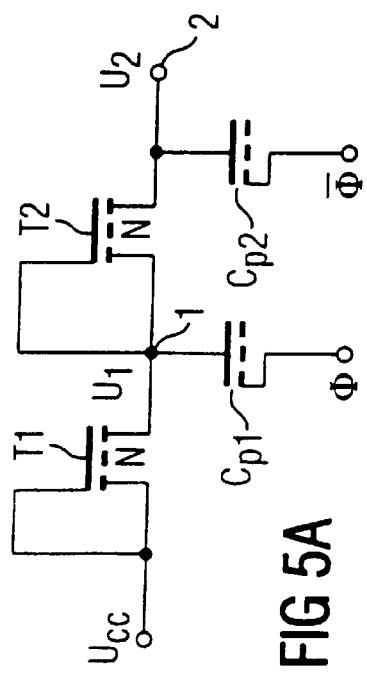
FIG 5A

SEMICONDUCTOR DEVICE AND METHOD FOR ITS FABRICATION

BACKGROUND OF THE INVENTION

Field of the Invention

The present invention relates to a semiconductor device and a method for its fabrication.

Though applicable to all semiconductor devices, and specifically to semiconductor devices for power and logic circuits, the present invention and the problems on which it is based are explained with regard to a PMOS transistor for a charge pump circuit in a p-type semiconductor substrate made of silicon.

In the case of customary PMOS transistors using twin CMOS well process technology with the p-type semiconductor substrate, the n-type well in which a transistor is situated cannot be biased negatively with respect to the p-type substrate because an interfering substrate current would flow via a relevant forward-biased pn junction.

The same applies correspondingly in the case of NMOS transistors using triple CMOS well process technologies with a p-type semiconductor substrate, where a further p-type well is additionally provided in the n-type well, or for the respective conductivity types with an n-type semiconductor substrate.

The negative source voltage customarily used in the case of such PMOS transistors effects an increase in the threshold voltage as a result of the so-called substrate control effect.

This effect manifests itself disruptively, for example, in the design of the customary charge pump circuit used for the on-chip generation of an increased voltage of, typically, 10 to 15 V from a supply voltage of typically 5 V.

On account of the problems outlined below, the effectiveness of the charge pump circuit diminishes as the threshold voltage of the NMOS transistors provided in a diode connection increases.

In the case of the charge pumps, the increased threshold voltage is intrinsically accepted and specific countermeasures are implemented in order to overcome the problem. In the case of a PMOS charge pump circuit for −12 V, for example, a boost circuit for increasing the gate voltage and also a correspondingly adapted number of pump stages are provided in order to compensate for the reduced effectiveness due to the substrate control of the PMOS transistors. However, solutions of this type are complicated in terms of circuitry.

SUMMARY OF THE INVENTION

It is accordingly an object of the invention to provide a semiconductor device and method for its fabrication which overcome the above-mentioned disadvantages of the prior art devices and methods of this general type, in which the substrate control problem is avoided.

With the foregoing and other objects in view there is provided, in accordance with the invention, a semiconductor device, including: a semiconductor substrate of a first conductivity type; a first well of a second conductivity type disposed in the semiconductor substrate; a second well of the first conductivity type disposed in the first well; a third well of the second conductivity type disposed in the second well; and a MOS transistor having a source region and a drain region of the first conductivity type, the MOS transistor formed in the third well.

The semiconductor device according to the invention has the advantage over the known solutions in that the substrate control problems can be avoided from the outset by virtue of the fact that the well in which the MOS transistor is located can be biased to the same potential as the source and/or drain terminal of the transistor. The circuitry countermeasures of the prior art can thus be completely omitted.

The idea on which the present invention is based consists in using a quadruple well structure in order to be able to configure the well of the semiconductor device in which the MOS transistor is located such that it can be decoupled from wells located underneath it and to configure a substrate such that it can be decoupled.

According to a preferred embodiment, either the source region or the drain region and also the third well and the second well are connected to receive a first predetermined potential.

According to a further preferred embodiment, the first well and the semiconductor substrate are connected to receive a second predetermined potential.

According to another preferred embodiment, the first conductivity type is p-type and the second conductivity type is n-type.

According to a further preferred embodiment, the first predetermined potential is a negative potential and the second predetermined potential is a ground potential.

According to another preferred embodiment, the first conductivity type is n-type and the second conductivity type is p-type.

According to a further preferred embodiment, the first predetermined potential is a positive potential and the second predetermined potential is a ground potential.

With the foregoing and other objects in view there is also provided, in accordance with the invention, a method for fabricating a semiconductor device, which includes: implantating and diffusing a first well in a semiconductor substrate; implantating and diffusing a second well in the first well; implantating a third well in the second well; and forming a MOS transistor in the third well.

With the foregoing and other objects in view there is further provided, in accordance with the invention, a charge pump circuit, including: a semiconductor substrate of a first conductivity type; a first well of a second conductivity type disposed in the semiconductor substrate; a second well of the first conductivity type disposed in the first well; a third well of the second conductivity type disposed in the second well; and a MOS transistor having a source region and a drain region of the first conductivity type, the MOS transistor formed in the third well.

Other features which are considered as characteristic for the invention are set forth in the appended claims.

Although the invention is illustrated and described herein as embodied in a semiconductor device and a method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a graph of an exemplary doping profile for the semiconductor device shown in FIG. 1;

FIG. 4 is an enlarged graph of the exemplary doping profile in accordance with FIG. 3;

FIG. 5a is a circuit diagram of a prior art charge pump circuit; and

FIGS. 5b and 5c are time dependent graphs of the prior art charge pump circuit.

DESCRIPTION OF THE PREFERRED EMBODIMENTS

Figure 2:
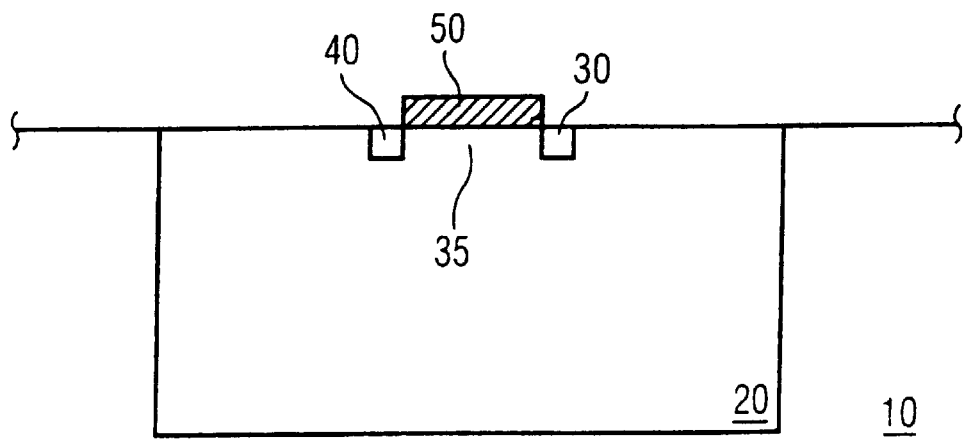
FIG. 2 is a sectional view of a prior art PMOS transistor using twin CMOS well process technology.

In all the figures of the drawing, sub-features and integral parts that correspond to one another bear the same reference symbol in each case. Referring now to the figures of the drawing in detail and first, particularly, to FIG. 2 thereof, there is shown a prior art PMOS transistor using twin CMOS well process technology. In FIG. 2, reference numeral 10 designates a p-doped semiconductor substrate, 20 designates an n-well, 30 designates a $p^+$-type source region and 40 designates a $p^+$-type drain region. A channel region 35 is disposed between the $p^+$-type source region 30 and the $p^+$-type drain region 40. The doping of the channel region 35 depends on the desired type of transistor, which is to say normally on or off. Reference numeral 50 designates a customary gate oxide/polysilicon structure.

In the case of customary PMOS transistors using twin CMOS well process technology with the use of an n-type semiconductor substrate, the n-type well in which the transistor is situated cannot be biased negatively with respect to the p-type substrate because an interfering substrate current would flow via a relevant forward-biased pn junction.

The same applies correspondingly in the case of corresponding NMOS transistors using triple CMOS well process technology with the use of a p-type semiconductor substrate, where a further p-type well is additionally provided in the n-type well, or for the respective conductivity types with the use of an n-type semiconductor substrate.

Therefore, the negative source voltage customarily used in the case of such PMOS transistors effect an increase in the threshold voltage as a result of the so-called substrate control effect.

This effect manifests itself disruptively, for example, in the circuit of a customary charge pump circuit as is illustrated in FIG. 5 and is used for the on-chip generation of an increased voltage of, typically, 10 to 15 V from a supply voltage of typically 5 V.

In FIG. 5a, T1 designates a first NMOS transistor in a diode connection, T2 designates a second NMOS transistor in a diode connection, $C_{p1}$ designates a first pump capacitor, $C_{p2}$ designates a second pump capacitor, $\phi$ designates a driving signal, /$\phi$ designates the complementary driving signal, $U_1$ designates a potential at node 1, $U_2$ designates a potential at the node 2 and $U_{cc}$ designates a supply voltage.

FIG. 5b shows the time dependence of the complementary driving signal /$\phi$, and FIG. 5c shows the time dependence of the potential $U_2$ at the second node 2. $U_{Tn}$ designates the threshold voltage of the NMOS transistors T1 and T2.

The circuit functions as follows. The channel capacitance of the NMOS transistor T1 is charged to a potential $U_1=U_{cc}-U_{Tn}$, where the driving signal $\phi=0$ V. If the clock voltage changes to $U_{cc}$, then the voltage is increased at node 1 to become $U_1=2_{Ucc}-U_{Tn}$. In this case, no current can flow via the NMOS transistor T1 since it acts as a diode. The further stage with the NMOS transistor T2 which is driven by the complementary driving signal /$\phi$ produces a further voltage increase at node 2 such that $U2=3\ U_{cc}-2\ U_{Tn}$. A desired voltage increase can be achieved, therefore, by a corresponding number of stages.

On account of the problems outlined above, the effectiveness of the charge pump circuit diminishes as the threshold voltage $U_{Tn}$ of the NMOS transistors T1 and T2 provided in a diode connection increases.

Figure 1:
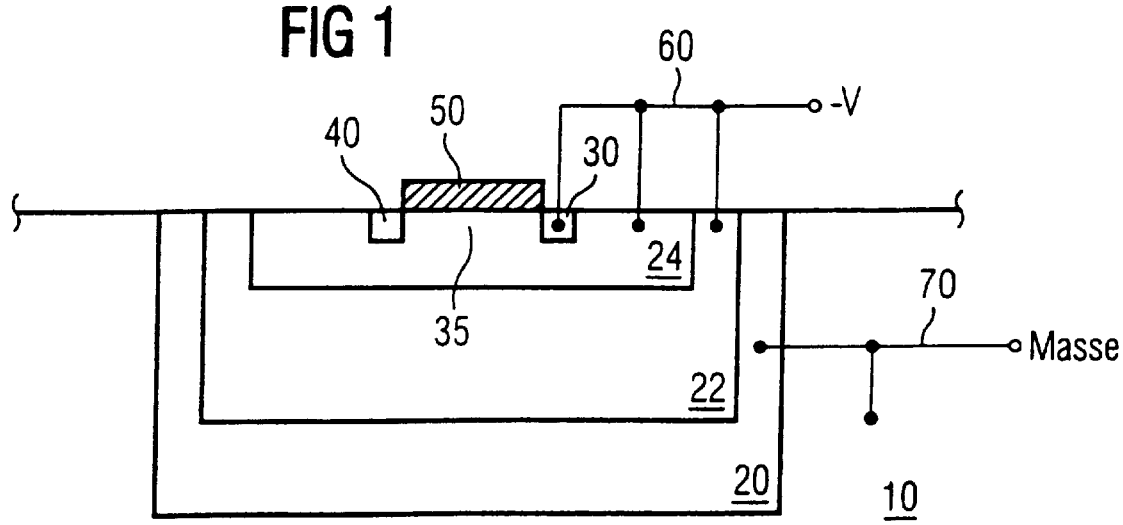
FIG. 1 is a diagrammatic, sectional view of an exemplary embodiment of a semiconductor device according to the invention.

In FIG. 1, there is shown an exemplary embodiment of the semiconductor device according to the invention. In FIG. 1, reference numeral 22 designates a p-type well and 24 designates a further n-type well. In contrast to the customary PMOS transistor using twin CMOS well process technology in accordance with FIG. 2, the PMOS transistor is in this case provided in the further n-type well 24.

Reference numeral 60 designates a connecting line by which a source region 30, the further n-type well 24 and the p-type well 22 are connected to receive a first predetermined potential –V.

Reference numeral 70 designates a connecting line by which the n-type well 20 and the semiconductor substrate 10 are connected to receive a second predetermined potential, expediently a ground potential.

The structure makes it possible to avoid the substrate control effect because the source region 30, the further n-type well 24 and the p-type well 22 are at the same negative potential –V. In this case, the pn junction between the further n-type well 24 and the p-type well 22 is not biased. Furthermore, the pn junction between the p-type well 22 and the n-type well 20 is reverse-biased. Finally, the pn junction between the n-type well 20 and the semiconductor substrate 10 is not biased.

A preferred method for fabricating the exemplary embodiment, illustrated in FIG. 1, of the semiconductor device according to the invention is explained below.

First of all, the semiconductor substrate 10 is provided. The n-type well 20 is then implanted and diffused. The next step is implantation and diffusion of the p-type well 22. This is followed merely by implantation of the further n-type well 24, because the further n-type well 24 is not deep, to be precise it is typically in the region of below 1 mm. Finally, the MOS transistor is formed in the further n-type well 24.

A suitable starting point for the method for fabricating the exemplary embodiment, illustrated in FIG. 1, of the semiconductor device according to the invention is a customary triple well process in which the deep n-type well 20 and the deep p-type well 22 are already realized. A low-voltage logic well that can be realized, in principle, using such a process is suitable as the shallow n-type well 24.

FIG. 3 shows an exemplary doping profile for the exemplary embodiment of the semiconductor device according to the invention as shown in FIG. 1. FIG. 4 shows a detailed enlargement of the exemplary doping profile in accordance with FIG. 3.

FIGS. 3 and 4 illustrate the net concentration as a solid line, the channel implantations not being shown.

A low-voltage logic well implanted in a retrograde manner after the field oxide complex was used as the shallow n-type well 24, with the result that no additional process steps were necessary.

In accordance with this exemplary doping profile, the long channel threshold voltage of the PMOS transistors in the semiconductor device according to the invention turns out to be $V_T=-1.3$ V (without channel implantation). $V_T=+$ 0.8 V can be achieved given the use of channel implantation provided in the process.

In the event of using the PMOS transistor in a diode connection in the charge pump circuit, the following noteworthy effects can be achieved. It is possible to avoid the increase in the threshold voltage due to the substrate control effect and thus to increase the effectiveness of the pump, and the booster circuit can be obviated since a voltage drop from the source to drain does not occur as with forward biasing.

Although the present invention has been described above using preferred exemplary embodiments, it is not restricted thereto but rather can be modified in diverse ways.

In particular, the doping profiles specified are not to be assessed in a restrictive manner but rather can be modified depending on the application. The same also applies correspondingly to the respective conductivity types and external potentials with the use of a semiconductor substrate.

In addition, the further n-type well 24 may also be correspondingly diffused, if necessary.

Finally, the p-type well 22, the further n-type well 24 and the source region 30 may also be at different potentials.

What is claimed is:

1. A semiconductor device, comprising:
   a semiconductor substrate of a first conductivity type;
   a first well of a second conductivity type disposed in said semiconductor substrate;
   a second well of said first conductivity type disposed in said first well;
   a third well of said second conductivity type disposed in said second well;
   a transistor having a source region and a drain region of said first conductivity type, said transistor formed in said third wells;
   a terminal connected to said second well, said third well and one of said source region and said drain region, said terminal for receiving a predetermined potential;
   a further terminal connected to said first well and to said semiconductor substrate, said further terminal receiving a further predetermined potential.

2. The semiconductor device according to claim 1, wherein said first conductivity type is p-type and said second conductivity type is n-type.

3. The semiconductor device according to claim 2, wherein said predetermined potential is a negative potential and said further predetermined potential is a ground potential.

4. The semiconductor device according to claim 1, wherein said first conductivity type is n-type and said second conductivity type is p-type.

5. The semiconductor device as claimed in claim 4, wherein said predetermined potential is a positive potential and said further predetermined potential is a ground potential.

6. The semiconductor device according to claim 1, wherein said transistor is an MOS transistor.

* * * * *